(12) United States Patent
Frank et al.

(10) Patent No.: US 8,596,623 B2
(45) Date of Patent: Dec. 3, 2013

(54) DEVICE AND PROCESS FOR LIQUID TREATMENT OF A WAFER SHAPED ARTICLE

(75) Inventors: Dieter Frank, Lind Ob Velden (AT); Michael Puggl, Eltweg (AT)

(73) Assignee: Lam Research AG, Villach (AT)

( * ) Notice: Subject to any disclaimer, the term of this patent is extended or adjusted under 35 U.S.C. 154(b) by 934 days.

(21) Appl. No.: 12/642,117

(22) Filed: Dec. 18, 2009

(65) Prior Publication Data

US 2011/0151675 A1 Jun. 23, 2011

(51) Int. Cl.
*H01L 21/465* (2006.01)
(52) U.S. Cl.
USPC .............................. 269/55; 438/748; 118/728
(58) Field of Classification Search
USPC ............ 269/55, 60, 21, 289 R, 903; 438/748; 156/345.1, 345.55; 216/92; 257/E21.485
See application file for complete search history.

(56) References Cited

U.S. PATENT DOCUMENTS

| 4,903,717 A | 2/1990 | Sumnitsch |
| 5,762,391 A | 6/1998 | Sumnitsch |
| 6,328,846 B1 | 12/2001 | Langen |
| 2004/0055707 A1 | 3/2004 | Sato et al. |
| 2005/0193952 A1* | 9/2005 | Goodman et al. ............ 118/728 |
| 2007/0087568 A1 | 4/2007 | Koyata et al. |

FOREIGN PATENT DOCUMENTS

JP 2001070859 A 3/2001

OTHER PUBLICATIONS

International Search Report, dated Sep. 22, 2011 in, PCT/IB2010/055550.

* cited by examiner

*Primary Examiner* — Monica Carter
*Assistant Examiner* — Melanie Alexander
(74) *Attorney, Agent, or Firm* — Young & Thompson

(57) ABSTRACT

A spin chuck in an apparatus for single wafer wet processing has structures at its periphery that, in combination with a supported wafer, form a series of annular nozzles that direct flowing gas from a chuck-facing surface of the wafer, around the edge of the wafer, and exhaust the gas away from the non-chuck-facing surface of the wafer, thereby preventing treatment fluid applied to the non-chuck-facing surface from contacting the edge region of the wafer. Retaining pins with enlarged heads engage the wafer edge and prevent it from being displaced upwardly when a high flow rate of gas is utilized.

13 Claims, 3 Drawing Sheets

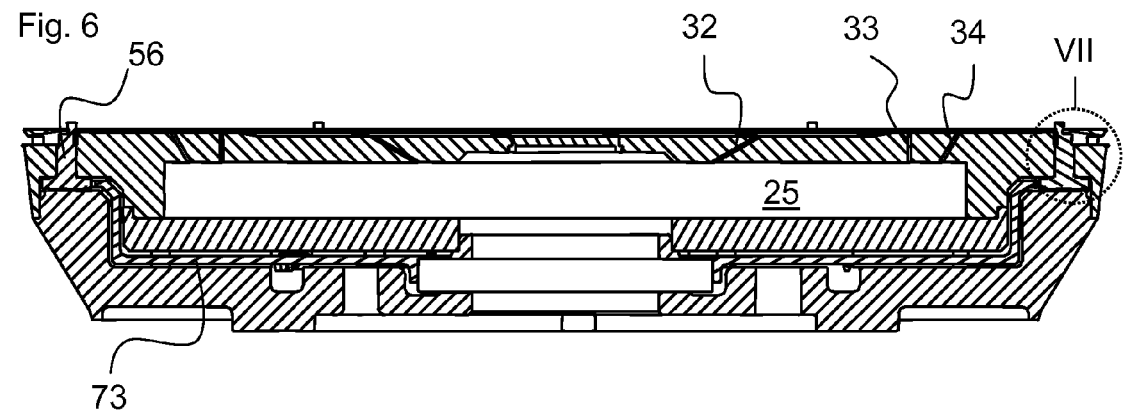
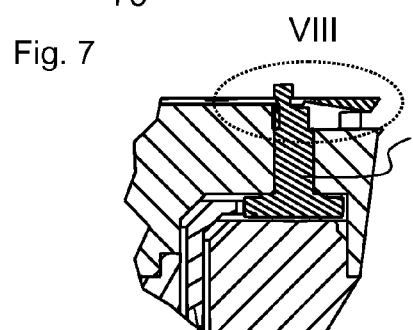
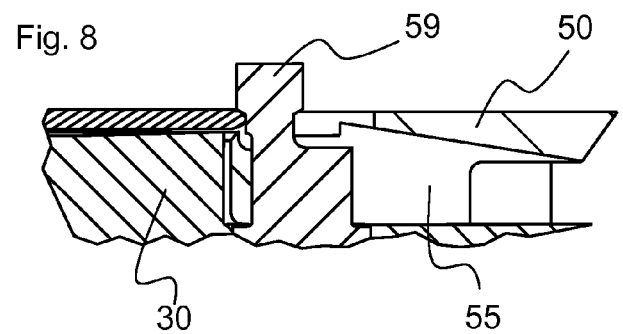
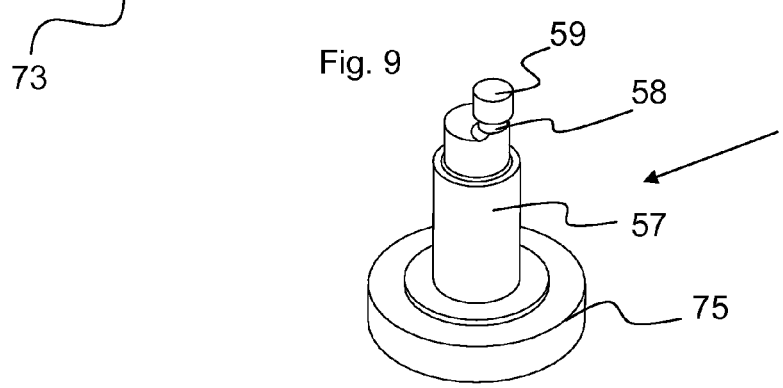

DEVICE AND PROCESS FOR LIQUID TREATMENT OF A WAFER SHAPED ARTICLE

BACKGROUND OF THE INVENTION

1. Field of the Invention

The invention relates to a device and a process for liquid treatment of a surface of a wafer-shaped article.

2. Description of Related Art

Liquid treatment includes both wet etching and wet cleaning, wherein the surface area of a wafer to be treated is wetted with a treatment liquid and a layer of the wafer is thereby removed or impurities are thereby carried off. A device for liquid treatment is described in U.S. Pat. No. 4,903,717. In this device the wafer-shaped article is mounted on a spin chuck and treatment liquid is applied from above the chuck onto the surface of the wafer not facing the chuck. The distribution of the liquid may be assisted by the rotational motion of the wafer. Such rotational motion may also assist in removing the liquid from the surface of the wafer as the liquid is flung off laterally over the edge of the wafer. The '717 patent discloses a chuck that flushes the chuck-facing surface of the wafer with a gas. In doing so, an annular nozzle is formed between the peripheral edge of the chuck and the peripheral edge of the main surface of the wafer facing the chuck. The flowing gas is exhausted from this annular nozzle and thereby limits the extent to which treatment liquid can flow onto the chuck-facing surface of the wafer; however, there is no provision for limiting treatment of the edge surfaces of the wafer while treating the upper main surface of the wafer.

U.S. Pat. No. 6,328,846 discloses guide elements on the periphery of a spin chuck that selectively engage the edge of a wafer supported by the chuck and thereby limit undesirable lateral motion of a wafer while it is being treated. Three or more pins in the shape of cylinders are disclosed as sufficient to limit the lateral motion of the wafer when spaced around the wafer and moved to engage the wafer's edge. The pins are disposed perpendicular to the main surface of the wafer and the chuck and extend above the chuck through bores. The pins extend above the edge of the wafer and move against the wafer after placement on the chuck. In the embodiment disclosed in the patent, the wafer floats above the chuck on a cushion of gas exhausted from the chuck. The gas flushes the surface of the wafer facing the chuck and is exhausted from the chuck at the peripheral edge of the wafer.

The '846 patent discloses that treatment liquid can flow along the pins when engaged against the wafer's edge and treat the lower opposite main surface of the wafer, leading to so called pin marks on the wafer's edge and chuck-facing surface. To avoid this problem, the '846 patent discloses a separate nozzle associated with each pin and localized at the pin structure to flush the pin area with a gas. The gas prevents the treatment liquid from flowing along the pin and treating the edge surfaces and chuck-facing surface of the wafer.

SUMMARY OF THE INVENTION

In certain processes, it is desirable to treat a main surface of the wafer while not treating the opposite main surface of the wafer and also not treating the edge surfaces of the wafer. In certain processes, it is furthermore desirable to prevent treatment of the edge surfaces of a wafer along the entire circumference of the wafer. It may also be desirable to limit the vertical displacement of the wafer during such treatment if using a gas at flow rates in excess of those necessary to create an equilibrium with the vacuum forces attracting the wafer to the chuck. In particular, for chucks that use gas flushing of the underside of a wafer to control liquid treatment applied to the top side of the wafer, such as disclosed in the '717 and '846 patents, it can be desirable to increase the flow of gas to affect the means by which the flowing gas controls or limits the treatment liquid. However, increasing the flow of gas in such chucks can lift the wafer away from the chuck if the wafer is not secured against such vertical movement.

One object of the invention is to limit treatment of the edge and downwardly-facing surfaces of a wafer during liquid treatment of an upwardly-facing surface of a wafer. The invention achieves this by guiding a flow of gas to generally follow the contours of a wafer's edge surfaces. The gas flushes the edge surfaces and thereby prevents processing liquid applied to an upper main surface of the wafer from treating an edge area of the wafer defined by the flowing gas.

In preferred embodiments a plurality of annular nozzles serves to flush substantially the entire circumference of the wafer's edge. These annular nozzles define narrow and less narrow annular passages as measured from the surface of the wafer facing the structures through which gas flows around the edge of the wafer, and then away from the upper surface of the wafer. The preferred embodiments also include retaining pins with heads configured to limit the movement of the wafer in the vertical direction when the gas flow underneath the wafer is increased.

The disclosed embodiments are spin chucks that uses a flow of gas to support the wafer upon a gas cushion; however, the invention is also applicable to treating surfaces of other materials, for example glass masters and mother panels used in manufacturing optical disks and LCD display panels.

BRIEF DESCRIPTION OF THE DRAWINGS

The accompanying drawings illustrate preferred embodiments of the present invention and, together with the ensuing description, serve further to explain the invention. In the drawings:

FIG. 6 is a view similar to FIG. 2 at a different angular orientation of the spin chuck 1;

FIG. 7 is an enlarged view of detail VII of FIG. 6;

FIG. 8 is an enlarged view of the detail VIII of FIG. 7; and

FIG. 9 is a perspective view of a pin 56 as shown in FIG. 7.

DESCRIPTION OF THE PREFERRED EMBODIMENTS

Figure 1:
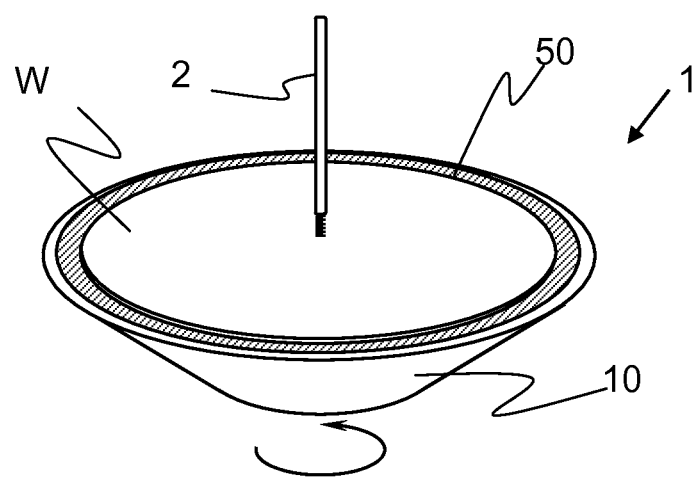
FIG. 1 is a schematic perspective view of an apparatus for single wafer wet processing, including a spin chuck 1 comprising a ring 50 and carrying a wafer W.

In FIG. 1 wafer W is floats on a cushion of gas and is prevented from moving upward beyond a predetermined distance above the spin chuck 1 by pins that will be described hereinafter. Processing liquid is dispensed onto the wafer through dispenser 2. As described in detail below, ring 50 is configured to prevent processing liquid from treating the wafer's underside or more than a predetermined amount of the wafer's edge surfaces.

Figure 2:
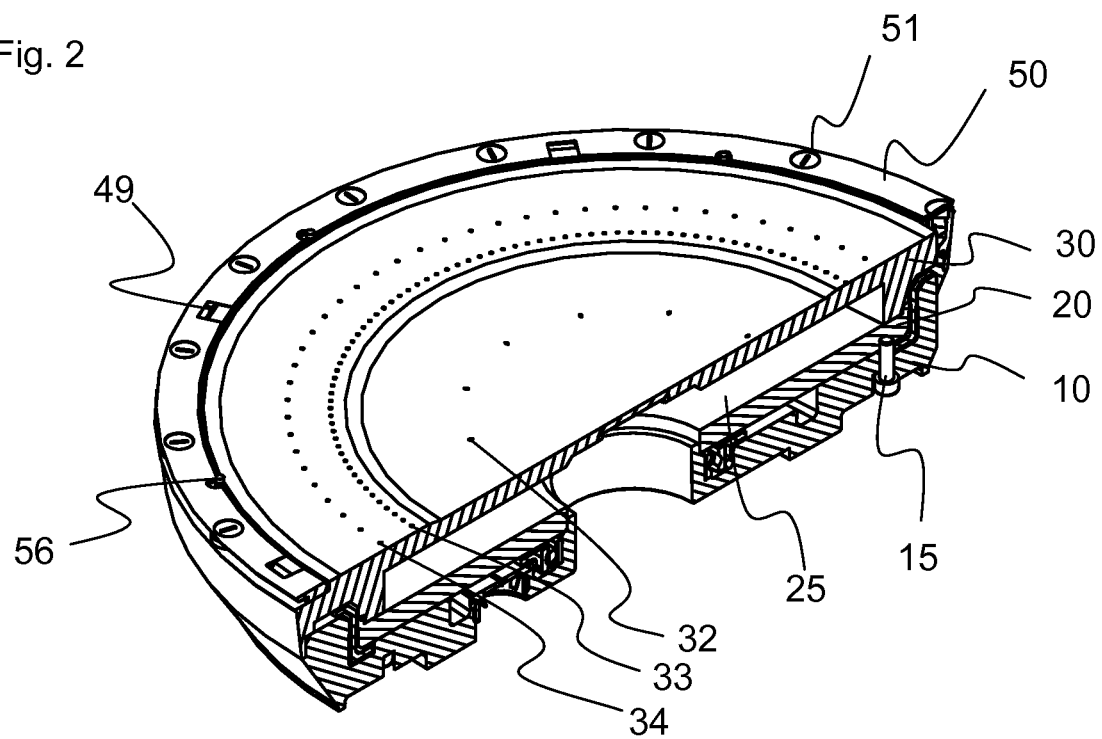
FIG. 2 is a more detailed perspective view, partly in section, of the spin chuck of FIG. 1.

As shown in FIG. 2 the spin chuck 1 includes three base body elements: a lower part 10, a middle part 20, and an upper part 30. The lower and middle base body elements are preferably secured together with screws, one of which is shown at 15.

Ring 50 is mounted to the chuck by mounting screws 51. The ring has openings to allow gripping pins 56 to extend through ring 50 and above the upper plane of the chuck. Six pockets 49 are formed into the ring so that an edge-contact-only gripper (e.g. as described in U.S. Pat. No. 5,762,391) can remove a wafer from the chuck or place a wafer onto the chuck.

Between the middle part 20 and the upper part 30 there is space 25 that can be filled with clean pressurized gas (e.g. nitrogen). Pressurized gas in space 25 flows through the three concentrically arranged arrays of nozzles: the inner nozzle array 32, the middle nozzle array 33, and the outer nozzle array 34. The gas exhausted through the nozzles 32, 33, 34 provides a gas cushion, on which the wafer floats and may also assist in securing the wafer to the chuck via the Bernoulli principle.

Figure 3:
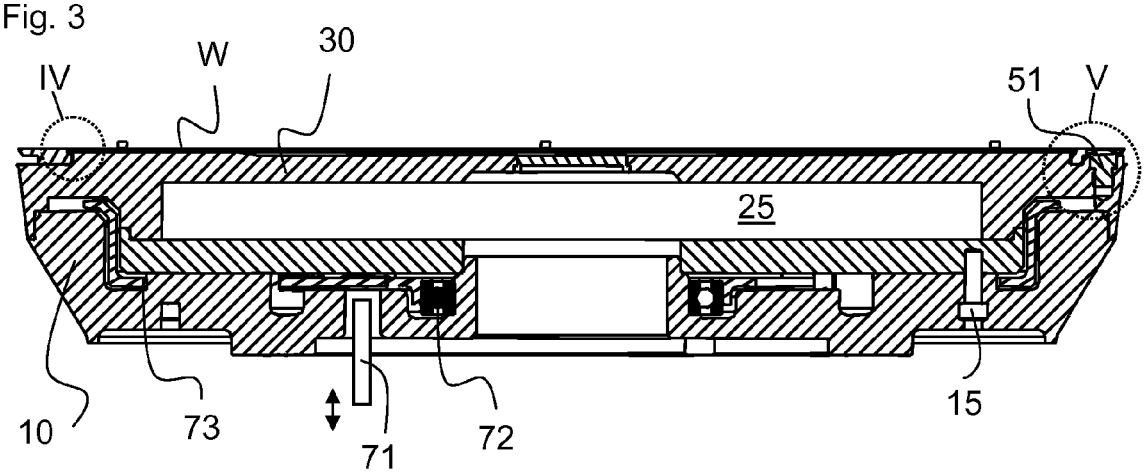
FIG. 3 is an axial cross-section of the spin chuck of FIG. 1.

In FIG. 3, between the lower part 10 and the middle part 20, there is a space provided that accommodates a toothed gear ring 73, which is connected to the lower base body element through the ball bearing 72. With rod 71 the tooth gear 73 can be fixed when the chuck rotates by a few degrees so that the tooth gear 73 drives the pins 56 for opening. The tooth gear is held in a closed position by springs (not shown).

Figure 4:
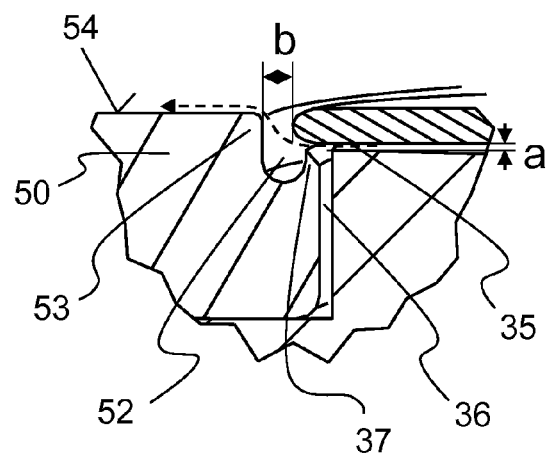
FIG. 4 is an enlarged view of detail IV of FIG. 3.

FIG. 4 depicts in detail the structures of upper base body 30 and ring 50 that route the gas exhausted from nozzles 32, 33, and 34 from the chuck-facing surface of the wafer, around the edge portion of wafer, and away from the upper surface of the wafer.

The upper surface of the upper base body part 30 (the chuck surface facing the wafer) is conical in its peripheral region, and describes a cone whose apex is below the upper surface of the chuck. Thus, when a wafer W is positioned perpendicular to the axis of rotation of the chuck and at a predetermined distance of the chuck, the horizontal downwardly-facing periphery of the wafer and the conical periphery of the upper chuck surface will together define an annular nozzle 35 that narrows radially outwardly of the chuck and terminates in an annular opening of axial extent "a". In the depicted embodiment the opening "a" is 0.3 mm. More generally, the opening "a" is preferably in the range of 0.1 mm to 1 mm, and more preferably in the range of 0.2 mm to 0.5 mm.

The conical periphery of the upper base body part 30 is delimited by a convex cylindrical shoulder that confronts ring 50 and is separated therefrom by an annular gap or space 36 that is thus defined radially inwardly by that shoulder. The other bounds of space 36 are the concave cylindrical radially-inwardly facing surface of ring 50, a lower portion of based body 30, and, in use, the wafer. Gas is exhausted into this space from nozzle 35.

A second annular nozzle is defined by the conical lip 37 formed on ring 50 together with the overlying wafer surface. In the embodiment shown, gas exiting nozzle 35 and passing through gap 36 must pass though the annular nozzle formed by lip 37 and the wafer, and substantially all gas exhausted from gap 36 passes through this annular nozzle. This second nozzle is formed by the differential distance between the lip 37 and the wafer W at its narrowest point and distances upstream from this point (i.e. in space or gap 36) where the distances between the chuck (i.e. the ring and base body 30) are greater. As depicted, the distance between the chuck and the wafer narrows in the direction of flow along the slanted portion of lip 37. Also, more upstream distances between the chuck and the wafer in space 36 are greater than any such distance along the slanted portion of lip 37.

A third annular nozzle is formed by shoulder 53 and the peripheral edge of wafer W that it confronts. Gas exhausted from the nozzle created by lip 37 and the wafer encounters annular space 52. Space 52 includes distances from the wafer to the chuck (i.e. ring 50) greater than the narrowest distance from the wafer to the chuck at lip 37. Also, distance "b" of the annular nozzle created by shoulder 53 represents a relative narrowing of the distance of the chuck to the wafer as compared to those in space 52. The distance "b" is preferably 0.3 mm to 3 mm, and more preferably 0.5 mm to 2 mm. Gas is exhausted from the third nozzle in a manner that prevents treatment liquid from treating the wafer's edge surfaces.

The three annular nozzles depicted in FIG. 4 are each formed by the combination of the chuck and the wafer. For each nozzle, the shape of the chuck is such that the more upstream portions of the nozzle define a relatively greater distance from the wafer than the distance from the water defined by more downstream portions of the nozzle. These differential distances correspond to differential volume areas through which gas flows.

Figure 5:
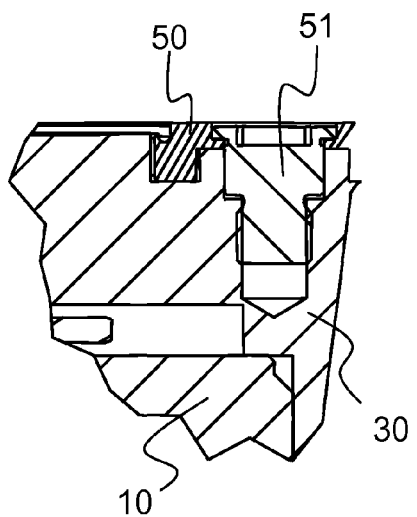
FIG. 5 is an enlarged view of detail V of FIG. 3.

FIG. 5 depicts the manner in which screws 51 secure ring 50 to upper base body 30. Although the depicted embodiment provides for a ring 50, alternative embodiments could integrate the structures necessary for creating the plurality of peripheral annular nozzles into the chuck base body. For example, ring 50 could be integrated into base element 30 and the lip 37, shoulder 53, and the annular space 52 between these could be integrated into base 30 rather than ring 50.

Pins 56 have a specific shape at their upper end to limit the movement of the wafer in the axial direction during its treatment. The upper end of each pin 56 is mushroom-shaped or outwardly flared at head 59 (see FIGS. 8 and 9). The ring 50 includes holes allowing the pin to pass through the ring and pivot through its eccentric range of motion (see FIG. 8). In order to drain the hole provided for the pin an opening 55 is provided in the ring 50. Tooth gear 73 drives the pins though complementary gear teeth (not shown) at the base 75 of the pins. The tooth gear 73 controls the opening and closing of the pins onto the wafer by rotating the pins.

In a typical processing of a wafer, when the wafer is loaded a gas flow is selected that allows the wafer to be supported above the chuck on a cushion without touching the chuck. This initial gas flow corresponds to that conventionally used in Bernoulli-type chucks, which is to say that the rate of flow is selected such that the upwardly directed force on the wafer approximately counterbalances the vacuum force created by the radially-outwardly accelerating gas flow. After the pins are closed and the wafer is confined against further upward displacement, the gas flow may be selectively increased, which increases the lifting force of the gas flow. However, the vertical lifting of the wafer from the chuck will be limited due to the pins. The pins are shaped with a head portion of increased diameter as compared to a body portion. By using such pins, the vertical movement of the wafer is limited and an increase in the rate of flow of gas increases the velocity of the gas through the series of annular nozzles, but not the distance of the wafer from the chuck.

The steps of a typical wafer processing according to the invention are described in the following table:

| Process Step | Pins | N2-volume flow | spin speed of the chuck [rpm] | etchant volume flow (HF) 20°-80° C. | DI-water 20°-80° C. | time [s] |
|---|---|---|---|---|---|---|
| 1 load | open | 10 L/min | 0 | 0 | 0 | 5 |
| 2 after pin close | closed | 50-400 L/min (preferably 200-300) | 100 | 0 | 0 | 2 |

-continued

| Process Step | Pins | N2-volume flow | spin speed of the chuck [rpm] | etchant volume flow (HF) 20°-80° C. | DI-water 20°-80° C. | time [s] |
|---|---|---|---|---|---|---|
| 3 process | closed | 50-400 L/min (preferably 200-300) | 100-2000 (preferably 300-1500) | 0.5-3.0 L/min | 0 | 5-1000 (preferably 10-60) |
| 4 spin off | closed | 50-400 L/min (preferably 200-300) | 500-2000 (preferably 1000-1500) | 0 | 0 | 2-30 (preferably 5-10) |
| 5 pre wafer shift | closed | 10 L/min | 100-1500 (preferably 300-500) | 0 | 0 | 1 |
| 6 wafer shift | open | 10 L/min | e.g. 100/500/100 500/100/500 | 0 | 0 | 0.1 |
| 7 etching process | closed | 50-400 L/min (preferably 200-300) | 100-2000 (preferably 300-1500) | 0.5-3.0 L/min | 0 | 5-1000 (preferably 10-60) |
| 8 rinsing | closed | 50-400 L/min (preferably 200-300) | 100-2000 (preferably 300-1500) | 0 | 0.5-3.0 L/min | 5-60 (preferably 15-25) |
| 9 spin dry | closed | 50-400 L/min (preferably 200-300) | 500-2000 (preferably 1000-1500) | 0 | 0 | 5-60 (preferably 15-25) |
| 10 unload | open | 50-400 L/min (preferably 100-200) | 0 | 0 | 0 | 5 |

The wafer shift at step 6 is desirable because the wafer edge will be treated differently at the pocket areas 49 and at the areas near the pins 56. In order to achieve a more evenly processed wafer edge the wafer is preferably shifted by some degrees with respect to the chuck. Depending on the direction of the rotation whether clockwise or counter-clockwise the chuck speed will be reduced or increased for example by a tenth of a second. Because of the moment of inertia of the tooth gear 73 the tooth gear will rotate some degrees relative to the chuck base body and thus the pins will be opened. When the pins are open the wafer will rotate relative to the chuck due to its moment of inertia. Thereafter the wafer is automatically secured by the pins again, but at a somewhat twisted position.

It will therefore be understood that the ring profile depicted in FIG. 4 (and, optionally, also gap 36) may be interrupted by other structures such as the pins 56 and the pockets 49. The ring profile as depicted in FIG. 4 nevertheless preferably extends over a majority of the circumference of the upper surface of the chuck body, and furthermore preferably extends uninterrupted over multiple arcuate ranges spanning from 15° to 20° of the full 360° circumference of the upper surface of the chuck body.

The foregoing description and the illustrative embodiments of the present invention have been described in detail with respect to a particular embodiment. It should be understood, however, that the foregoing description of the present invention is exemplary only, and that the scope of the present invention is to be limited only to the claims as properly construed.

For chucks that support the wafer with a gas cushion, and/or for chucks securing the wafer with the Bernoulli effect, the same gas medium used for supporting the wafer and/or used to regulate the Bernoulli effect may be directed through the plurality of edge-region annular nozzles according to the invention. For such chucks, each annular nozzle is disposed peripheral to an area where the gas cushion is formed between the chuck and the wafer.

Although the depicted embodiment provides that the same gas flow assists in supporting the wafer and, additionally, is utilized to prevent treatment fluid from reaching the wafer's edge surfaces according to the invention, it is not necessary that the present invention be implemented on a chuck utilizing such a gas cushion.

What is claimed is:

1. A device for treating a surface of a substrate, comprising:
   a holder adapted to position a substrate in a predetermined orientation;
   a first upper peripheral surface of said holder adapted to define with a substrate positioned above said holder a first nozzle;
   a second upper peripheral surface of said holder positioned outwardly from said first upper peripheral surface and adapted to define with a substrate positioned above said holder a second nozzle;
   wherein the first and second upper peripheral surfaces are separated by a recess formed therebetween;
   a gas supply configured to provide an outwardly directed gas flow across said first and second upper peripheral surfaces; and
   an inwardly facing peripheral surface of said holder positioned outwardly of said first and second upper peripheral surfaces and confronting a peripheral edge of a substrate positioned on said holder, said inwardly facing peripheral surface being configured to direct a gas flow exiting said second nozzle upwardly;
   wherein said first upper peripheral surface is formed on an upper part of said holder and said second upper peripheral surface and said inwardly facing peripheral surface are formed on a ring rigidly secured to said upper part of said holder.

2. The device according to claim 1, wherein said device is an apparatus for single wafer wet processing, and wherein said holder is a spin chuck.

3. The device according to claim 1, further comprising a peripheral series of pins adapted to contact a peripheral edge of a substrate positioned on said holder, said pins extending upwardly from said holder and being positioned outwardly of said first upper peripheral surface and at least in part inwardly of said inwardly facing peripheral surface.

4. The device according to claim 3, wherein said pins have an enlarged head adapted to engage a peripheral edge of a substrate so as to prevent vertically upward displacement of a substrate.

5. The device according to claim 1, wherein said recess is a first generally cylindrical gap surrounding said first nozzle and extending axially downwardly between said first and second nozzles.

6. The device according to claim 5, wherein said second nozzle and said inwardly facing peripheral surface are separated by a second generally cylindrical gap defining a third annular nozzle, said second generally cylindrical gap being wider than said first generally cylindrical gap and extending axially downwardly to a depth shallower than that of said first generally cylindrical gap.

7. The device according to claim 1, wherein said first and second upper peripheral surfaces of said holder are conical and describe respective cones each having an apex positioned downwardly of said first and second upper peripheral surfaces.

8. A process for treating a surface of a substrate, comprising:
confining a substrate at a predetermined distance above a holder;
directing a gas flow against a peripheral region of a downwardly-facing surface of the substrate, the holder comprising a first upper peripheral surface defining with the substrate a first nozzle and a second upper peripheral surface positioned outwardly from the first upper peripheral surface and defining with the substrate a second nozzle, the first and second upper peripheral surfaces being separated by a recess formed therebetween, and an inwardly facing peripheral surface positioned outwardly of the first and second upper peripheral surfaces and confronting a peripheral edge of the substrate;
wherein the gas flow is passed through the first and second nozzles and is then directed by the inwardly facing peripheral surface upwardly; and
wherein the first upper peripheral surface is formed on an upper part of the holder and the second upper peripheral surface and the inwardly facing peripheral surface are formed on a ring rigidly secured to the upper part of the holder.

9. The process according to claim 8, wherein the substrate is confined at the predetermined distance above the holder by a series of pins that engage a peripheral edge of the substrate.

10. The process according to claim 9, wherein the gas flow is supplied at a flow rate that would lift the substrate above the predetermined distance were it not confined by the series of pins.

11. The process according to claim 10, wherein the flow rate is 50-400 L/min.

12. The process according to claim 10, wherein the flow rate is 200-300 L/min.

13. The process according to claim 8, wherein the holder is a spin chuck in an apparatus for single wafer wet processing and wherein the substrate is a semiconductor wafer.

* * * * *